United States Patent
Sakui et al.

(10) Patent No.: US 12,315,558 B2
(45) Date of Patent: May 27, 2025

(54) SEMICONDUCTOR ELEMENT MEMORY DEVICE

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 168 days.

(21) Appl. No.: 18/228,433

(22) Filed: Jul. 31, 2023

(65) Prior Publication Data

US 2023/0377635 A1 Nov. 23, 2023

Related U.S. Application Data

(63) Continuation-in-part of application No. PCT/JP2021/003725, filed on Feb. 2, 2021.

(51) Int. Cl.
  *G11C 11/4096* (2006.01)
  *G11C 11/408* (2006.01)
  (Continued)

(52) U.S. Cl.
  CPC ...... *G11C 11/4096* (2013.01); *G11C 11/4085* (2013.01); *G11C 11/4091* (2013.01); *G11C 11/4094* (2013.01)

(58) Field of Classification Search
  CPC .......................... G11C 11/4096; G11C 11/408
  See application file for complete search history.

(56) References Cited

U.S. PATENT DOCUMENTS

| 11,990,204 B2 * | 5/2024 | Sakui | ............ G11C 11/404 |
| 2006/0049444 A1 | 3/2006 | Shino | |

(Continued)

FOREIGN PATENT DOCUMENTS

| JP | H02188966 A | 7/1990 |
| JP | H03171768 A | 7/1991 |

(Continued)

OTHER PUBLICATIONS

Written Opinion of the International Searching Authority in International Application No. PCT/JP2021/003725, dated March 30, 2021 (4 pages).

(Continued)

*Primary Examiner* — Min Huang
(74) *Attorney, Agent, or Firm* — Crowell & Moring LLP

(57) ABSTRACT

A memory device uses semiconductor elements. By controlling voltages applied to plate lines, word lines, source lines, and bit lines, the memory device performs a data write operation of holding positive hole groups formed by an impact ionization phenomenon or by a gate-induced drain leakage current in a semiconductor base material, and a data erase operation of removing positive hole groups from inside the semiconductor base material. The memory device includes a block made up of memory cells, which are arrayed in a matrix. Storage data of memory cells connected with a first word line, i.e., a selected one of the word lines, in the block is read to the bit lines by applying a first voltage to the first word line, and a second voltage to a second word line adjacent to the first word line.

10 Claims, 13 Drawing Sheets

(51) Int. Cl.
  *G11C 11/4091* (2006.01)
  *G11C 11/4094* (2006.01)

(56) References Cited

U.S. PATENT DOCUMENTS

| | | | |
|---|---|---|---|
| 2008/0212366 A1 | 9/2008 | Ohsawa | |
| 2012/0092925 A1* | 4/2012 | Chen | H10D 30/711 |
| | | | 365/182 |
| 2014/0159114 A1* | 6/2014 | Zheng | H10D 30/0413 |
| | | | 438/585 |
| 2021/0193661 A1* | 6/2021 | Lee | H10B 12/00 |
| 2022/0406781 A1* | 12/2022 | Sakui | G11C 11/406 |

FOREIGN PATENT DOCUMENTS

| | | |
|---|---|---|
| JP | 2006-80280 A | 3/2006 |
| JP | H3957774 | 5/2007 |
| JP | 2008-218556 | 9/2008 |

OTHER PUBLICATIONS

Takato, H., et al., "Impact of Surrounding Gate Transistor (SGT) for Ultra-High-Density LSI's", *IEEE Transactions on Electron Devices*, vol. 38, No. 3, Mar. 1991, pp. 573-578 (6 pages).

Chung, H., et al. "Novel $4F^2$ DRAM Cell with Vertical Pillar Transistor(VPT)" *2011 Proceedings of the European Solid-State Device Research Conference* (2011) (4 pages).

Wong, H.S., P., et al., "Phase Change Memory" *Proceedings of the IEEE*, vol. 98, No. 12, Dec. 2010, pp. 2201-2227 (27 pages).

Tsunoda, K., et al., "Low Power and High Speed Switching of Ti-doped NiO ReRAM under the Unipolar Voltage Source of less than 3 V" IEDM (2007) pp. 767-770, (4 pages).

Kang, W., et al., "Reconfigurable Codesign of STT-MRAM Under Process Variations in Deeply Scaled Technology" *IEEE Transactions on Electron Devices*, vol. 62, No. 6, Jun. 2015, pp. 1769-1777 (9 pages).

Ertosun, M. G., et al., "Novel Capacitorless Single-Transistor Charge-Trap DRAM 1T CT DRAM) Utilizing Electrons" *IEEE Electron Device Letters*, vol. 31, No. 5, May 2010, pp. 405-407 (3 pages).

Wan, J., et al., "A Compact Capacitor-Less High-Speed DRAM Using Field Effect-Controlled Charge Regeneration" *IEEE Electron Device Letters*, vol. 33, No. 2, Feb. 2012, pp. 179-181 (3 pages).

Ohsawa, T., et al., "Memory Design Using a One-Transistor Gain Cell on SOI", *IEEE Journal of Solid-State Circuits*, vol. 37, No. 11, Nov. 2022, pp. 1510-1522 (13 pages).

Shino, T., et al., "Floating Body RAM Technology and its Scalability to 32nm Node and Beyond", IEEE IEDM (2006) (4 pages).

Yoshida, E., et al., "A Design of a Capacitorless 1T-DRAM Cell Using Gate-induced Drain Leakage (GIDL) Current for Low-power and High-speed Embedded Memory" IEEE IEDM, pp. 913-916, Dec. 2003 (4 pages).

Song, J., et al., "Design Optimization of Gate-All-Around (GAA) MOSFETs" *IEEE Transactions on Nanotechnology*, vol. 5, No. 3, pp. 186-191, May 2006 (7 pages).

Loubet, N., et al., "Stacked Nanosheet Gate-All-Around Transistor to Enable Scaling Beyond FinFET" *2017 Symposium on VLSI Technology Digest of Technical Papers*, T230-T231, Jun. 2017 (2 pages).

Jiang, H., et al., "Experimental Investigation of Self-Heating Effect (SHE) in Multiple-Fin SOI FinFETS" *Semicond. Sci. Technol.* 29 (2014) 115021 (9 pages).

Yoshida, E., et al., "A Capacitorless 1T-DRAM Technology Using Gate-Induced Drain-Leakage (GIDL) Current for Low-Power and High-Speed Embedded Memory" *IEEE Transactions on Electron Devices*, vol. 53, No. 4, Apr. 2006 (6 pages).

\* cited by examiner

FIG. 2A

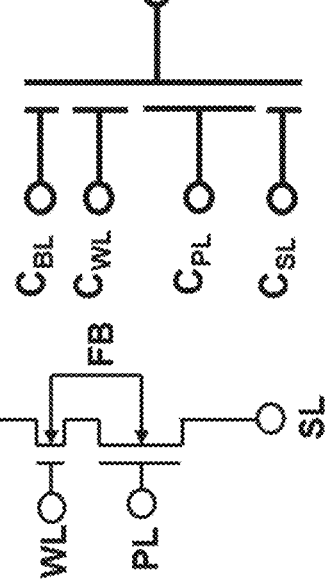

FIG. 2B

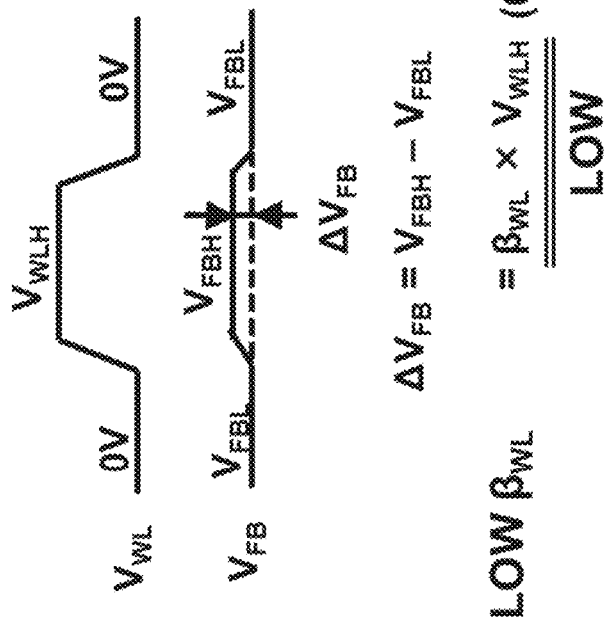

FIG. 2C

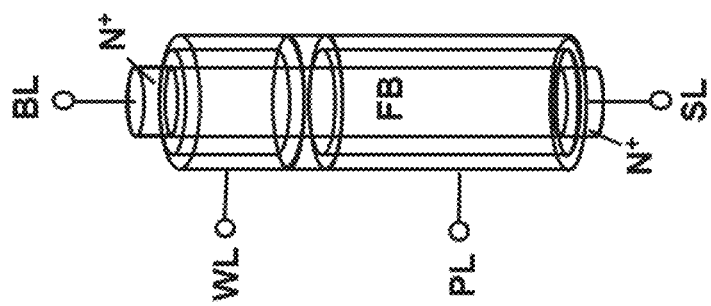

$$C_{FB} = C_{WL} + C_{PL} + C_{BL} + C_{SL} \quad (1)$$

$$\beta_{WL} = \frac{C_{WL}}{C_{WL} + C_{PL} + C_{BL} + C_{SL}} \quad (2) \Rightarrow \text{LOW } \beta_{WL}$$

$$\beta_{PL} = \frac{C_{PL}}{C_{WL} + C_{PL} + C_{BL} + C_{SL}} \quad (3) \Rightarrow \text{HIGH } \beta_{PL}$$

$$\beta_{BL} = \frac{C_{BL}}{C_{WL} + C_{PL} + C_{BL} + C_{SL}} \quad (4) \Rightarrow \text{LOW } \beta_{BL}$$

$$\beta_{SL} = \frac{C_{SL}}{C_{WL} + C_{PL} + C_{BL} + C_{SL}} \quad (5) \Rightarrow \text{LOW } \beta_{SL}$$

$$\Delta V_{FB} = V_{FBH} - V_{FBL} = \underline{\beta_{WL} \times V_{WLH}} \quad (6)$$
$$\qquad\qquad\qquad\qquad\qquad\qquad \text{LOW}$$

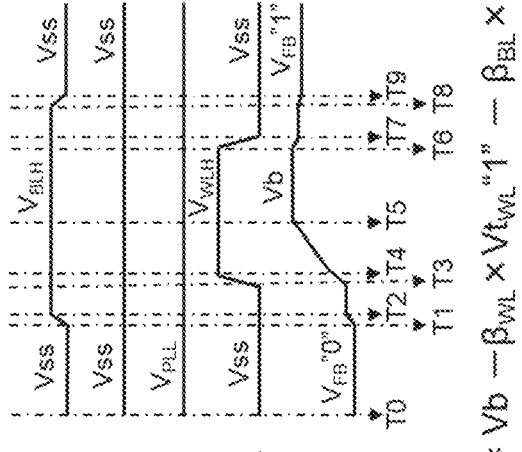
FIG. 3B
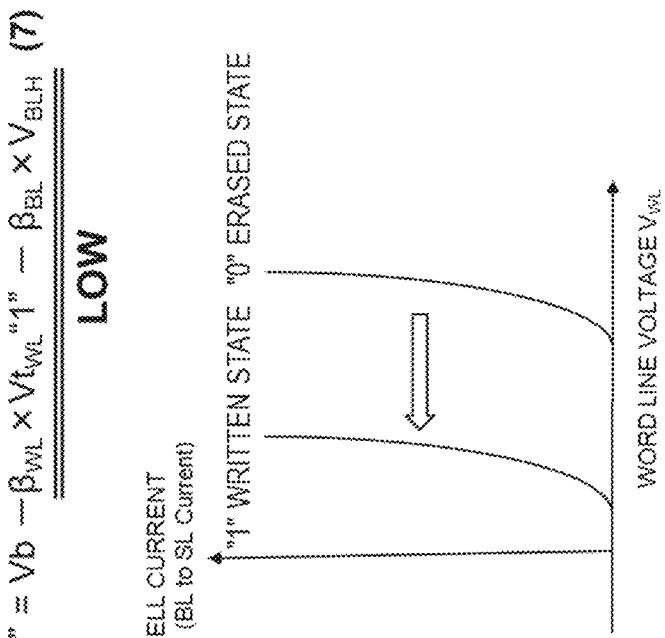
$$V_{FB}\text{"1"} = Vb - \beta_{WL} \times Vt_{WL}\text{"1"} - \beta_{BL} \times V_{BLH} \quad (7)$$
LOW
FIG. 3D
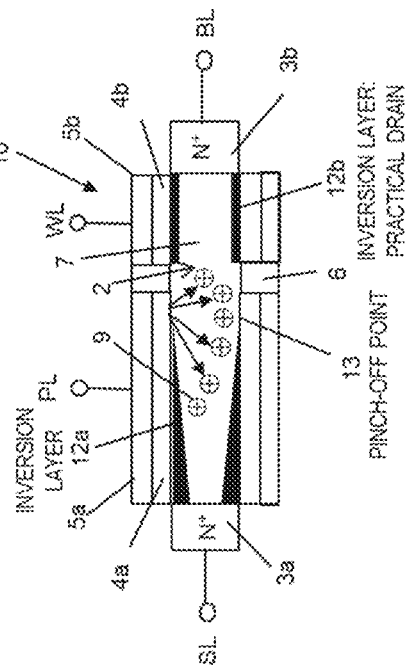
FIG. 3A "1" WRITING OPERATION
SOURCE-SIDE IMPACT IONIZATION
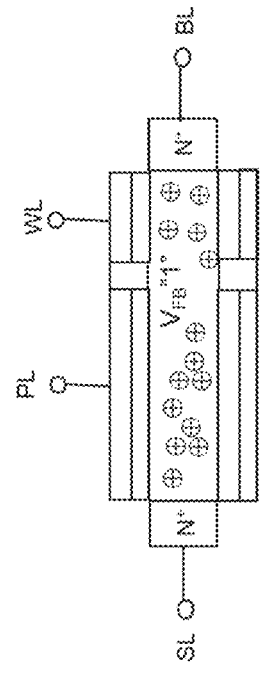
FIG. 3C "1" WRITTEN STATE

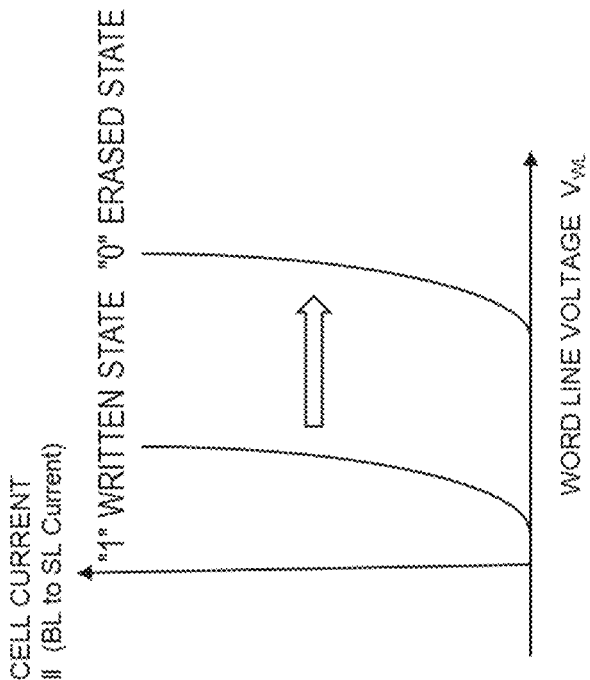
FIG. 4AC
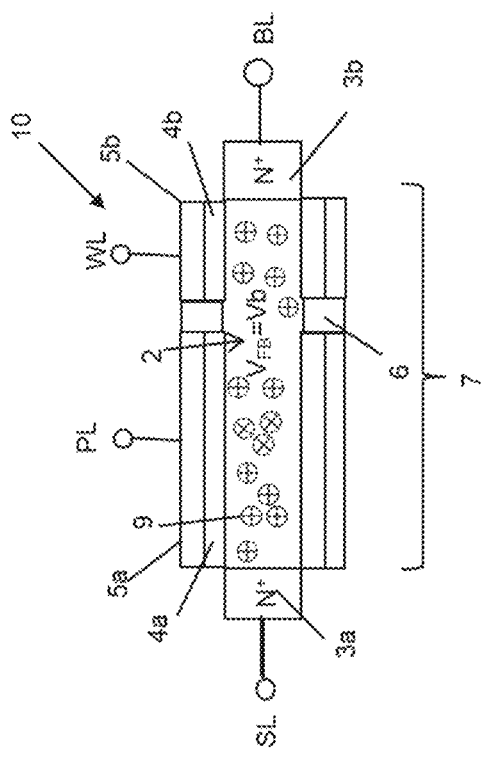
FIG. 4AA "1" WRITTEN STATE
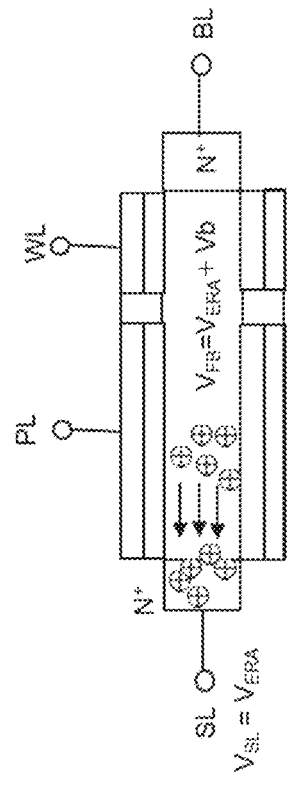
FIG. 4AB "0" ERASED STATE

FIG. 4B

ERASE OPERATION

| | SIGNAL LINE | APPLIED VOLTAGE |
|---|---|---|
| "0" ERASING | BIT LINE BL | $V_{SS}$ (EXAMPLE: 0 V) |
| | SOURCE LINE SL | $V_{ERA}$ (EXAMPLE: -3 V) |
| | PLATE LINE PL | $V_{PLL}$ (EXAMPLE: 2 V) |
| | WORD LINE WL | $V_{SS}$ (EXAMPLE: 0 V) |
| | FLOATING BODY FB | $V_{ERA} + V_b$ (EXAMPLE: -3 V + 0.7 V = -2.3 V) |

$V_b$: BUILT-IN VOLTAGE OF PN JUNCTION: TO 0.7 V

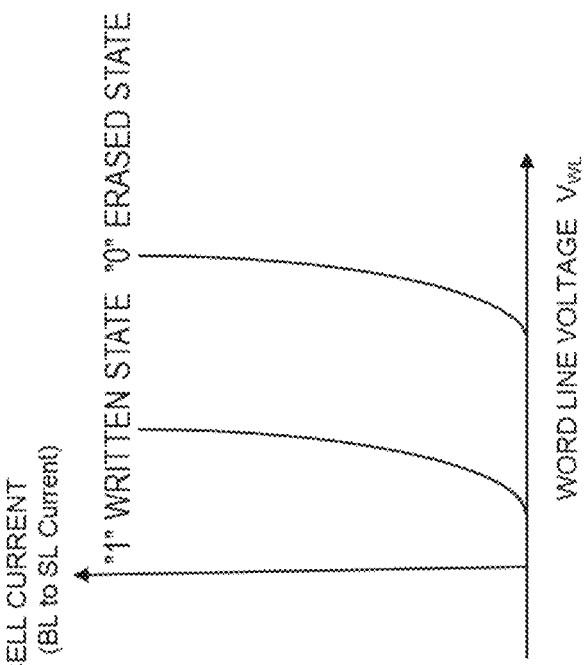
FIG. 5AC
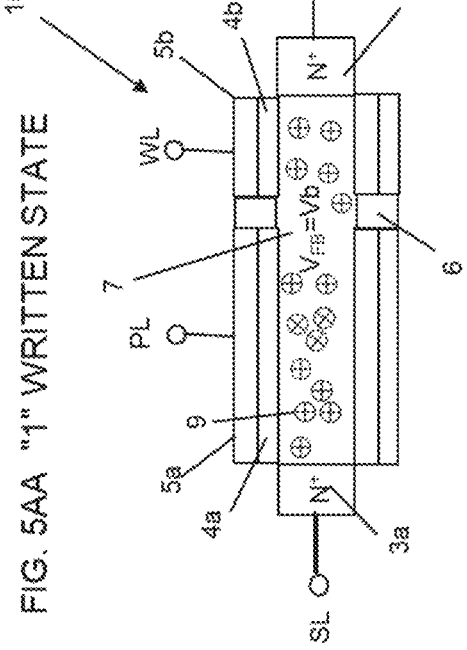
FIG. 5AA "1" WRITTEN STATE
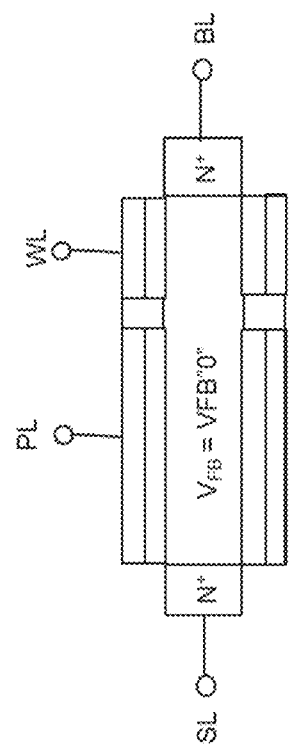
FIG. 5AB "0" ERASED STATE
Vb: BUILT-IN VOLTAGE: TO 0.7 V

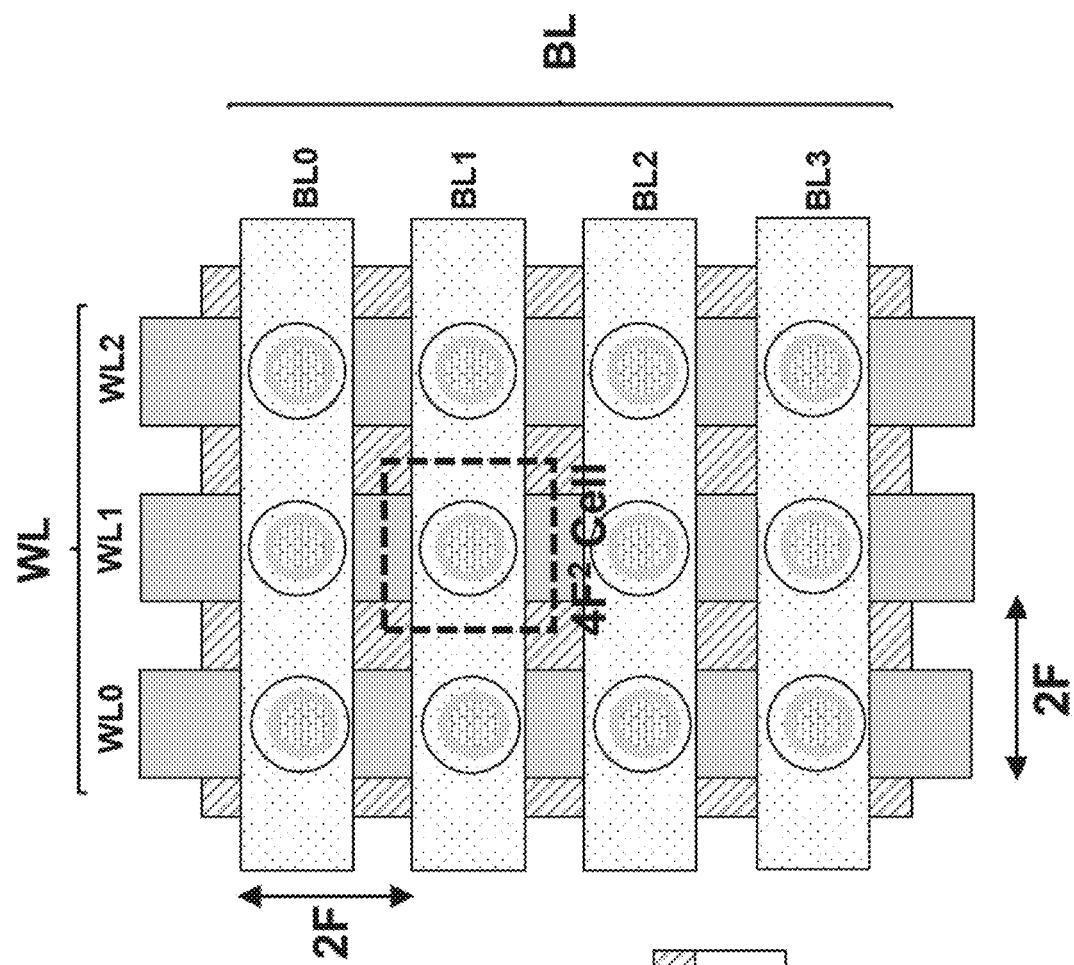
FIG. 5BA
FIG. 5BB
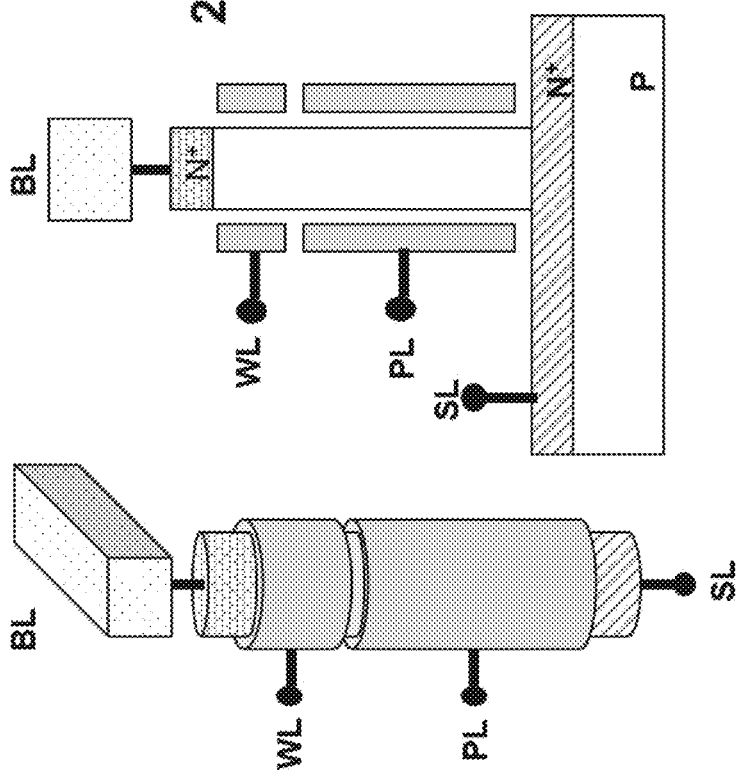
FIG. 5BC $$C_{FB} = C_{WL} + C_{BL} + C_{SL} \quad (8)$$

$$\beta_{WL} = \frac{C_{WL}}{C_{WL} + C_{BL} + C_{SL}} \quad (9)$$

$$\Delta V_{FB} = V_{FB2} - V_{FB1}$$
$$= \beta_{WL} \times V_{WLH} \quad (10)$$

US 12,315,558 B2

SEMICONDUCTOR ELEMENT MEMORY DEVICE

INCORPORATION BY REFERENCE

The present application is a Continuation-In-Part application of PCT/JP2021/003725, filed Feb. 2, 2021, the entire contents of which are incorporated herein by reference.

BACKGROUND OF THE INVENTION

Field of the Invention

The present invention relates to a semiconductor memory device that uses semiconductor elements.

Description of the Related Art

Recently, there has been demand for greater packaging density and higher performance of memory elements in the development of LSI (Large Scale Integration) technology.

In normal planar MOS transistors, a channel extends in a horizontal direction along an upper surface of a semiconductor substrate. In contrast, a channel of SGTs extends in a vertical direction along an upper surface of a semiconductor substrate (see, for example, Japanese Patent Laid-Open No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Consequently, the SGTs allow higher packaging density of a semiconductor device than do the planar MOS transistors. The use of the SGTs as selection transistors allows greater packaging density of DRAMs (Dynamic Random Access Memories; see, for example, H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)) connected with capacitors, PCMs (Phase Change Memories; see, for example, H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No 12, December, pp. 2201-2227 (2010)) connected with variable resistance elements, RRAMs (Resistive Random Access Memories; see, for example, T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V," IEDM (2007)), and MRAMs (Magnetoresistive Random Access Memories; see, for example, W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015) that varies resistance by changing magnetic spin direction by means of current. There is also a DRAM memory cell (see J. Wan, L. Rojer, A. Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012)) made up of a single MOS transistor without a capacitor. The present application relates to a dynamic flash memory that can be made up of MOS transistors without a variable resistance element or a capacitor.

FIGS. 7A to 7D show a write operation of the above-mentioned capacitorless DRAM memory cell made up of a single MOS transistor, FIGS. 8A and 8B show problems in operations, and FIGS. 9A to 9C show read operations (see, for example, J. Wan, L. Rojer, A. Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012); T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp 1510-1522 (2002); T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006); and E. Yoshida: "A Capacitorless 1T-DRAM Technology Using Gate-Induced Drain-Leakage (GIDL) Current for Low-Power and High-Speed Embedded Memory," IEEE IEDM (2006)). FIG. 7A shows a "1" written state. Here, the memory cell is formed on an SOI substrate 100, made up of a source $N^+$ layer 103 (hereinafter a semiconductor region containing a high concentration of donor impurities will be referred to as an "$N^+$ layer") connected with a source line SL, a drain $N^+$ layer 104 connected with a bit line BL, a gate conductive layer 105 connected with a word line WL, and a floating body 102 of a MOS transistor 110. That is, a DRAM memory cell is made up of a single MOS transistor 110 without a capacitor. Note that a $SiO_2$ layer 101 of the SOI substrate is placed in contact with an undersurface of the floating body 102. When "1" is written into the memory cell made up of the single MOS transistor 110, the MOS transistor 110 is operated in a saturation region. That is, an electron channel 107 extending from the source $N^+$ layer 103 has a pinch-off point 108 and does not reach the drain $N^+$ layer 104 connected with a bit line. If the MOS transistor 110 is operated with a gate voltage set to approximately ½ a drain voltage by applying high voltages to the bit line BL connected to the drain $N^+$ layer and the word line WL connected to the gate conductive layer 105 as described above, electric field strength is maximized at the pinch-off point 108 in the vicinity of the drain $N^+$ layer 104. As a result, accelerated electrons flowing from the source $N^+$ layer 103 towards the drain $N^+$ layer 104 collide with a Si lattice, and electron-hole pairs are created by kinetic energy lost at that moment. Most of the generated electrons (not shown) reach the drain $N^+$ layer 104. Only a few very hot electrons reach the gate conductive layer 105 by jumping over a gate oxide film 109. Positive holes 106 generated at the same time charge the floating body 102. In this case, the generated positive holes 106 contribute as an increment to majority carriers because the floating body 102 is made of p-type Si. The floating body 102 is filled with the generated positive holes 106, and if a voltage of the floating body 102 becomes higher than the source $N^+$ layer 103 by Vb or more, positive holes generated further are discharged to the source $N^+$ layer 103, where Vb is a built-in voltage of a pn junction between the source $N^+$ layer 103 and the floating body 102 in a p-layer, and is approximately 0.7 V. FIG. 7B shows how the floating body 102 is charged to saturation by the generated positive holes 106.

Next, a "0" writing operation of a memory cell 110 will be described using FIG. 7C. There are a memory cell 110 that writes "1" and a memory cell 110 that writes "0" randomly to a common select word line WL. FIG. 7C shows how a "1" written state is changed to a "0" written state. To write "0," the voltage of bit line BL is negatively biased and a pn junction between the drain N+ layer 104 and the floating body 102 in the p-layer is forward biased. As a result, positive holes 106 generated in the floating body 102 beforehand in the previous cycle flows to the drain N+ layer 104 connected to the bit line BL. Once the write operation finishes, two states of the memory cell follow: a state in which the memory cell 110 is filled with the generated positive holes 106 (FIG. 7B) and a state in which the generated positive holes are discharged from the memory cell 110 (FIG. 7C). The floating body 102 of the memory cell 110 filled with the positive holes 106 is higher in potential than the floating body 102 free of generated positive holes. Therefore, a threshold voltage of the memory cell 110 written with "1" is lower than a threshold voltage of the memory cell 110 written with "0." FIG. 7D shows how this looks like.

Next, problems in operations of the memory cell made up of a single MOS transistor 110 will be described using FIGS. 8A and 8B. As shown in FIG. 8A, capacitance $C_{FB}$ of the floating body is the sum total of capacitance $C_{WL}$ between a gate connected with a word line and the floating body, junction capacitance $C_{SL}$ of a pn junction between the source N+ layer 103 connected with a source line and the floating body 102, and junction capacitance $C_{BL}$ of a pn junction between the drain N+ layer 104 connected with the bit line and the floating body 102; and is given by $$C_{FB}=C_{WL}+C_{BL}+C_{SL} \quad (8)$$

A capacitive coupling ratio $\beta_{WL}$ between the gate connected with a word line and the floating body is given by $$\beta_{WL}=C_{WL}/(C_{WL}+C_{BL}+C_{SL}) \quad (9)$$

Therefore, if a word line voltage $V_{WL}$ swings during reading or writing, a voltage of the floating body 102 serving as a memory node (contact) of the memory cell is also affected. FIG. 8B shows how this looks like. If a word line voltage $V_{WL}$ rises from 0 V to $V_{WLH}$ during reading or writing, a voltage $V_{FB}$ of the floating body 102 rises from $V_{FB1}$ to $V_{FB2}$ due to capacitive coupling with the word line, where $V_{FB1}$ is an initial voltage before the word line voltage changes. The amount of change $\Delta V_{FB}$ in voltage is given by $$\Delta V_{FB}=V_{FB2}-V_{FB1}=\beta_{WL} \times V_{WLH} \quad (10)$$

In $\beta_{WL}$ in Eq. (9), a contribution ratio of $C_{WL}$ is large, and is expressed, for example, by $C_{WL}:C_{BL}:C_{SL}=8:1:1$. In this case, $\beta_{WL}=0.8$. If the word line, for example, is 5 V during writing and 0 V after the end of writing, due to capacitive coupling of the word line WL and floating body 102, the floating body 102 is subjected to amplitude noise as high as $5 \text{ V} \times \beta_{WL}=4$ V. This poses a problem in that a sufficient margin of potential difference between a logic 1 potential and logic 0 potential of the floating body 102 cannot be secured during writing.

FIGS. 9A to 9C show a read operation, where FIG. 9A shows a "1" written state and FIG. 9B shows a "0" written state. Actually, however, even if Vb is written into the floating body 102 by writing of "1," if the word line returns to 0 V when the writing is finished, the floating body 102 is lowered to a negative bias. When "0" is being written, because the floating body 102 is negatively biased further, a sufficiently large margin of potential difference cannot be secured between "1" and "0" as shown in FIG. 9C, making it difficult to commercially introduce really capacitorless DRAM memory cells.

A capacitorless single-transistor DRAM (gain cell) has a problem in that there is large capacitive coupling between a word line and a floating body and if potential of the word line swings during data read or write, the swings are transmitted as noise directly to the floating body. This causes misreading or erroneous rewriting of storage data, making it difficult to put the capacitorless single-transistor DRAM (gain cell) to practical use.

SUMMARY OF THE INVENTION

To solve the above problem, a semiconductor memory device according to the present invention comprises a block in which a plurality of semiconductor memory cells is arrayed in a matrix, each of the semiconductor memory cells including: semiconductor base material erected on a substrate in a vertical direction of the substrate or extended on the substrate in a horizontal direction, a first impurity region and a second impurity region provided on opposite ends of the semiconductor base material; a gate insulating layer placed in contact with a lateral surface of the semiconductor base material between the first impurity region and the second impurity region; a first gate conductor layer covering part or all of the gate insulating layer; and a second gate conductor layer located adjacent to the first gate conductor layer and placed in contact with a lateral surface of the gate insulating layer, wherein positive hole groups generated by an impact ionization phenomenon or by a gate-induced drain leakage current are held in the semiconductor base material by controlling voltages applied to the first gate conductor layer, the second gate conductor layer, the first impurity region, and the second impurity region, a memory write operation is performed by setting a voltage of the semiconductor base material to a first data retention voltage, a memory erase operation is performed by controlling voltages applied to the first impurity region, the second impurity region, the first gate conductor layer, and the second gate conductor layer and thereby extracting a residual positive hole group out of the positive hole groups from one or both of the first impurity region and the second impurity region, the voltage of the semiconductor base material is set to a second data retention voltage lower than the first data retention voltage, and in the block, in each of the semiconductor memory cells, the first impurity region is connected with a source line, the second impurity region is connected with a bit line, and one of the first gate conductor layer and the second gate conductor layer is connected with word lines and another is connected with a first drive control line, and with a selected one of the word lines being designated as a first word line and a word line adjacent to the first word line being designated as a second word line, using a voltage applied to the source line, the bit line, and the first drive control line, a first voltage applied to the first word line, and a second voltage applied to the second word line, a memory read operation is performed to read storage data of a plurality of the semiconductor memory cells selected by the first word line, to the bit line (first aspect).

In the first aspect of the present invention, with a word line adjacent to the first word line and located on an opposite side of the second word line being designated as a third word line, using a voltage applied to the source line, the bit line, and the first drive control line, the first voltage applied to the first word line, and a second voltage applied to one or both of the second word line and the third word line, a memory read operation is performed to read storage data of a plurality of the semiconductor memory cells selected by the first word line, to the bit line (second aspect).

In the first aspect of the present invention, the storage data of the semiconductor base material is read to the bit line and a sense amplifier circuit determines whether the storage data is write data or erase data (third aspect).

In the first aspect of the present invention, the first voltage is a positive voltage and the second voltage is a negative voltage (fourth aspect).

In the second aspect of the present invention, one or both of the second word line and the third word line turn(s) to the second voltage at a first time point, the first word line turns to the first voltage at a second time point later than the first time point, and a memory read operation is performed to read storage data of a plurality of the semiconductor memory cells selected by the first word line, to the bit line (fifth aspect).

In the fifth aspect of the present invention, one or both of the second word line and the third word line turn(s) to the negative voltage at the first time point, the first word line turns to the positive voltage at the second time point, and a memory read operation is performed to read storage data of a plurality of the semiconductor memory cells selected by the first word line, to the bit line (sixth aspect).

In the first aspect of the present invention, the first drive control line is common to all the semiconductor memory cells making up the block (seventh aspect).

In the first aspect of the present invention, first gate capacitance between the first gate conductor layer and the semiconductor base material is higher than second gate capacitance between the second gate conductor layer and the semiconductor base material (eighth aspect).

In the first aspect of the present invention, one or both of the first gate conductor layer and the second gate conductor layer are divided into two or more separate gate conductor layers in planar view or in a vertical direction and the separate gate conductor layers are operated synchronously or asynchronously (ninth aspect).

In the ninth aspect of the present invention, in the vertical direction, either the separate gate conductor layers of the first gate conductor layer are placed on opposite sides of the second gate conductor layer, or the separate gate conductor layers of the second gate conductor layer are placed on opposite sides of the first gate conductor layer (tenth aspect).

BRIEF DESCRIPTION OF THE DRAWINGS

FIGS. 2A, 2B and 2C are diagrams explaining effects produced when gate capacitance of a first gate conductor layer 5a connected to a plate line PL of the memory device having the SGT according to the first embodiment is made higher than gate capacitance of a second gate conductor layer 5b connected with a word line WL;

FIGS. 3A, 3B, 3C and 3D are diagrams for explaining a write operation mechanism of the memory device having the SGT according to the first embodiment;

FIGS. 4AA, 4AB and 4AC are diagrams for explaining an erase operation mechanism of the memory device having the SGT according to the first embodiment;

FIG. 4B is a diagram for explaining the erase operation mechanism of the memory device having the SGT according to the first embodiment;

FIGS. 5AA, 5AB and 5AC are diagrams for explaining a read operation mechanism of the memory device having the SGT according to the first embodiment;

FIGS. 5BA, 5BB and 5BC are diagrams for explaining a read operation of the memory device having the SGT according to the first embodiment;

DETAILED DESCRIPTION OF THE PREFERRED EMBODIMENTS

Embodiments of a semiconductor memory device (hereinafter referred to as a dynamic flash memory) according to the present invention will be described below with reference to the drawings.

First Embodiment

A structure and operation mechanism of a dynamic flash memory cell according to a first embodiment of the present invention will be described below using FIGS. 1 to 6. The structure of the dynamic flash memory cell will be described using FIG. 1. Then, using FIGS. 2A to 2C, description will be given of effects produced when gate capacitance of a first gate conductor layer 5a connected to a plate line PL is made higher than gate capacitance of a second gate conductor layer 5b connected with a word line WL. Then, a data write operation mechanism will be described using FIGS. 3A to 3D, a data erase operation mechanism will be described using FIGS. 4AA to 4B, and a data read operation mechanism will be described using FIGS. 5AA to 5D.

Figure 1:
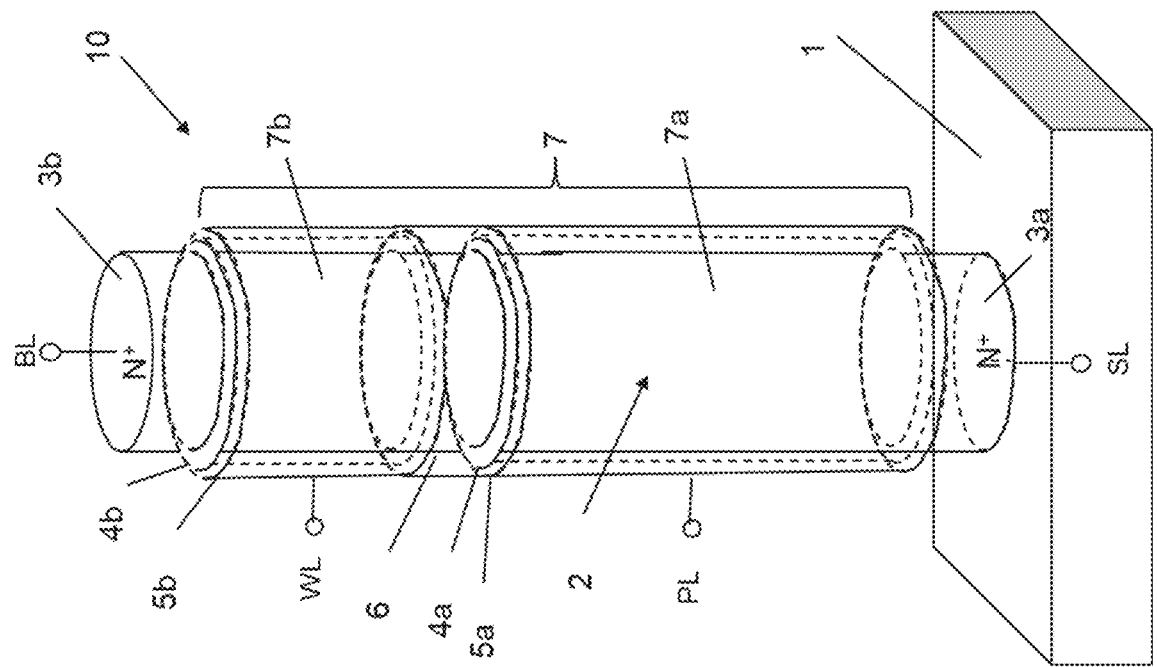
FIG. 1 is a structural diagram of a memory device having an SGT according to a first embodiment.

The structure of the dynamic flash memory cell according to the first embodiment of the present invention is shown in FIG. 1. $N^+$ layers 3a and 3b (which are examples of a "first impurity region" and a "second impurity region" described in Claims), one of which serves as a source while the other serves as a drain, are formed at upper and lower positions in a silicon semiconductor pillar 2 (which is an example of a "semiconductor base material" described in Claims, and will be referred to hereinafter as a "Si pillar") formed on a substrate 1 (which is an example of a "substrate" described in Claims) and having a P or i conductivity type (intrinsic type). That part of the Si pillar 2 which is between the $N^+$ layers 3a and 3b that serve as the source and the drain is a semiconductor base material 7 (which is an example of a "semiconductor base material" described in Claims). A first gate insulating layer 4a (which is an example of a "first gate insulating layer" described in Claims) and a second gate insulating layer 4b (which is an example of a "second gate insulating layer" described in Claims) are formed by surrounding the semiconductor base material 7. The first gate insulating layer 4a and the second gate insulating layer 4b are placed, respectively, in contact with, or close to, the $N^+$ layers 3a and 3b that serve as the source and the drain. The first gate conductor layer 5a (which is an example of a "first gate conductor layer" described in Claims) and the second gate conductor layer 5b (which is an example of a "second gate conductor layer" described in Claims) are formed by surrounding the first gate insulating layer 4a and the second gate insulating layer 4b, respectively. The first gate conductor layer 5a and the second gate conductor layer 5b are separated by an insulating layer 6 (which is an example of a "first insulating layer" described in Claims). The semiconductor base material 7 which is between the N+ layers 3a and 3b, is made up of a first channel Si layer 7a surrounded by the first gate insulating layer 4a (which is an example of a "first semiconductor base material" described in Claims) and a second channel Si layer 7b (which is an example of a "second semiconductor base material" described in Claims) surrounded by the second gate insulating layer 4b. This results in formation of a dynamic flash memory cell 10 made up of the N+ layers 3a and 3b, which are to become the source and the drain, the semiconductor base material 7, the first gate insulating layer 4a, the second gate insulating layer 4b, the first gate conductor layer 5a, and the second gate conductor layer 5b. Then, the N+ layer 3a to become the source is connected to the source line SL (which is an example of a "source line" described in Claims), the N+ layer 3b to become the drain is connected to the bit line BL (which is an example of a "bit line" described in Claims), the first gate conductor layer 5a is connected to the plate line PL which is a first drive control line (which is an example of a "first drive control line" described in Claims), and the second gate conductor layer 5b is connected to the word line WL (which is an example of a "word line" described in Claims). Desirably the gate capacitance of the first gate conductor layer 5a connected with the plate line PL is structured to be higher than the gate capacitance of the second gate conductor layer 5b connected with the word line WL.

Note that in FIG. 1, the first gate conductor layer 5a is made larger in gate length than the second gate conductor layer 5b such that the first gate conductor layer 5a connected to the plate line PL will be higher in gate capacitance than the second gate conductor layer 5b connected with the word line WL. In addition, however, instead of making the first gate conductor layer 5a larger in gate length than the second gate conductor layer 5b, film thicknesses of the gate insulating layers may be changed such that a gate insulating film of the first gate insulating layer 4a will be smaller in film thickness than a gate insulating film of the second gate insulating layer 4b. Also, materials of the gate insulating layers may be varied in permittivity such that the gate insulating film of the first gate insulating layer 4a will be higher in permittivity than the gate insulating film of the second gate insulating layer 4b. Besides, the first gate conductor layer 5a connected to the plate line PL may be made higher in gate capacitance than the second gate conductor layer 5b connected with the word line WL by combining any of the following: lengths of the gate conductor layers, 5a and 5b, and film thicknesses and permittivities of the gate insulating layers 4a and 4b.

FIGS. 2A to 2C are diagrams explaining effects produced when the gate capacitance of the first gate conductor layer 5a connected to the plate line PL is made higher than the gate capacitance of the second gate conductor layer 5b connected with the word line WL.

FIG. 2A shows only main part of the dynamic flash memory cell according to the first embodiment of the present invention in a simplified manner. The dynamic flash memory cell is connected with the bit line BL, the word line WL, the plate line PL, and the source line SL, whose voltage states determine a potential state of the semiconductor base material 7.

FIG. 2B is a diagram for explaining relationships among capacitances. Capacitance $C_{FB}$ of the semiconductor base material 7 is the sum total of capacitance $C_{WL}$ between the gate 5b connected with the word line WL and the semiconductor base material 7, capacitance $C_{PL}$ between the gate 5a connected with the plate line PL and the semiconductor base material 7, junction capacitance $C_{SL}$ of a pn junction between the source N+ layer 3a connected with the source line SL and the semiconductor base material 7, and junction capacitance $C_{BL}$ of a pn junction between the drain N+ layer 3b connected with the bit line BL and the semiconductor base material 7, and is given by $$C_{FB} = C_{WL} + C_{PL} + C_{BL} + C_{SL} \quad (1)$$

Therefore, a coupling ratio $\beta_{WL}$ between the word line WL and the semiconductor base material 7, a coupling ratio $\beta_{PL}$ between the plate line PL and the semiconductor base material 7, a coupling ratio $\beta_{BL}$ between the bit line BL and the semiconductor base material 7, and a coupling ratio $\beta_{SL}$ between the source line SL and the semiconductor base material 7 are given, respectively, by $$\beta_{WL} = C_{WL}/(C_{WL} + C_{PL} + C_{BL} + C_{SL}) \quad (2)$$

$$\beta_{PL} = C_{PL}/(C_{WL} + C_{PL} + C_{BL} + C_{SL}) \quad (3)$$

$$\beta_{BL} = C_{BL}/(C_{WL} + C_{PL} + C_{BL} + C_{SL}) \quad (4) \text{ and}$$

$$\beta_{SL} = C_{SL}/(C_{WL} + C_{PL} + C_{PL} + C_{SL}) \quad (5),$$

where $C_{PL} > C_{WL}$, and thus $\beta_{PL} > \beta_{WL}$.

FIG. 2C is a diagram for explaining changes of a voltage $V_{FB}$ in the semiconductor base material 7 when a voltage $V_{WL}$ of the word line WL rises during read and write operations and falls subsequently. Here, when the voltage $V_{WL}$ of the word line WL rises from 0 V to a high-voltage state $V_{WLH}$ and the voltage $V_{FB}$ of the semiconductor base material 7 changes from a low-voltage state $V_{FBL}$ to a high-voltage state $V_{FBH}$, a potential difference $\Delta V_{FB}$ is given by $$\Delta V_{FB} = V_{FBH} - V_{FBL} = \beta_{WL} \times V_{WLH} \quad (6)$$

Because the coupling ratio $\beta_{WL}$ between the word line WL and the semiconductor base material 7 is low and the coupling ratio $\beta_{PL}$ between the plate line PL and the semiconductor base material 7 is high, $\Delta V_{FB}$ is low and even if the voltage $V_{WL}$ of the word line WL rises and falls during read and write operations, the voltage $V_{FB}$ of the semiconductor base material 7 almost does not change.

A write operation of the dynamic flash memory cell according to the first embodiment of the present invention is shown in FIGS. 3A to 3D. FIG. 3A shows a mechanism of the write operation and FIG. 3B shows operation waveforms of the bit line BL, source line SL, plate line PL, word line WL, and semiconductor base material 7, which is indicated as the floating body FB. At time T0, the dynamic flash memory cell is in a "0" erased state and the voltage of the semiconductor base material 7 is $V_{FB}$ "0." Besides, Vss is applied to the bit line BL, the source line SL, and the word line WL while $V_{PLL}$ is applied to the plate line PL. Here, for example, Vss is 0 V and $V_{PLL}$ is 2 V. Next, from time T1 to time T2, when the bit line BL rises from Vss to $V_{ELH}$, for example, if Vss is 0 V, the voltage of the semiconductor base material 7 becomes $V_{FB}$ "0"+$\beta_{BL} \times V_{BLH}$ as a result of capacitive coupling between the bit line BL and the semiconductor base material 7.

Next, a write operation of the dynamic flash memory cell will be described using FIGS. 3A and 3B. From time T3 to time T4, the word line WL rises from Vss to $V_{WLH}$. Consequently, when the second gate conductor layer 5b connected with the word line WL sets a "0" erasing threshold voltage of a second n-channel MOS transistor region surrounding the semiconductor base material 7 to $Vt_{WL}$ "0," as the word line WL rises, from Vss to $Vt_{WL}$ "0," the voltage of the semiconductor base material 7 becomes $V_{FB}$ "0"+ $\beta_{BL} \times V_{BLH} + \beta_{WL} \times Vt_{WL}$ "0" as a result of capacitive coupling between the word line WL and the semiconductor base material 7. If the word line WL rises to or above $Vt_{WL}$ "0," an annular inversion layer 12b is formed in the semiconductor base material 7 inside the second gate conductor layer 5b, blocking second capacitive coupling between the word line WL and the semiconductor base material 7.

Description of the write operation of the dynamic flash memory cell will be continued using FIGS. 3A and 3B. From time T3 to time T4, for example, $V_{PLL}=2$ V is inputted constantly to the first gate conductor layer 5a connected with the plate line PL, raising the second gate conductor layer 5b connected with the word line WL to, for example, $V_{WLH}=4$ V. Consequently, as shown in FIG. 3A, an annular inversion layer 12a is formed on the semiconductor base material 7 inside the first gate conductor layer 5a connected with the plate line PL, with a pinch-off point 13 existing in the inversion layer 12a. As a result, a first n-channel MOS transistor region having the first gate conductor layer 5a operates in a saturation region. On the other hand, the second n-channel MOS transistor region having the second gate conductor layer 5b that is connected with the word line WL operates in a linear region. As a result, no pinch-off point exists in the semiconductor base material 7 inside the second gate conductor layer 5b connected with the word line WL, and an inversion layer 12b is formed on the entire surface. The inversion layer 12b formed on the entire inner circumference of the second gate conductor layer 5b connected with the word line WL operates as a practical drain of the second n-channel MOS transistor region having the second gate conductor layer 5b. As a result, an electric field is maximized and an impact ionization phenomenon occurs in a first boundary region of the semiconductor base material 7 between the first n-channel MOS transistor region having the first gate conductor layer 5a that is connected in series and the second n-channel MOS transistor region having the second gate conductor layer 5b. The first boundary region is a source-side region as viewed from the second n-channel MOS transistor region having the second gate conductor layer 5b that is connected with the word line WL, and thus the phenomenon is called a source-side impact ionization phenomenon. As a result of the source-side impact ionization phenomenon, electrons flow from the N$^+$ layer 3a connected with the source line SL toward the N$^+$ layer 3b connected with the bit line. Accelerated electrons collide with Si lattice atoms and electron-hole pairs are created by kinetic energy of the accelerated electrons. Part of the generated electrons flows to the first gate conductor layer 5a and the second gate conductor layer 5b, but most of the electrons flow to the N$^+$ layer 3b connected to the bit line BL (not shown).

As shown in FIG. 3C, generated positive hole groups 9 (which are examples of a "positive hole group" described in Claims) are majority carriers in the semiconductor base material 7 and charge the semiconductor base material 7 so as to be positively biased. The N$^+$ layer 3a connected with the source line SL is 0 V and thus the semiconductor base material 7 is charged to a built-in voltage Vb (approximately 0.7 V) of a pn junction between the N$^+$ layer 3a connected with the source line SL and the semiconductor base material 7. Once the semiconductor base material 7 is charged to be positively biased, threshold voltages of the first n-channel MOS transistor region and second n-channel MOS transistor region fall due to a substrate bias effect.

Description of the write operation of the dynamic flash memory cell will be continued using FIG. 3B. From time T6 to time T7, the voltage of the word line WL drops from $V_{WLH}$ to Vss. In so doing, the word line WL and the semiconductor base material 7 form second capacitive coupling, but until the voltage $V_{WLH}$ of the word line WL becomes equal to or lower than the threshold voltage $Vt_{WL}$ "1" of the second n-channel MOS transistor region when the voltage of the semiconductor base material 7 is Vb, the inversion layer 12b blocks the second capacitive coupling. Therefore, practical capacitive coupling between the word line WL and the semiconductor base material 7 is enabled only when the word line WL becomes equal to or lower than $Vt_{WL}$ "1" and falls to Vss. As a result, the voltage of the semiconductor base material 7 becomes Vb−$\beta_{WL} \times Vt_{WL}$ "1." Here, $Vt_{WL}$ "1" is lower than $Vt_{WL}$ "0" described above, and thus $\beta_{WL} \times Vt_{WL}$ "1" is low.

Description of the write operation of the dynamic flash memory cell will be continued using FIG. 3B. From time T8 to time T9, the bit line BL drops from $V_{BLH}$ to Vss. Since the bit line BL and the semiconductor base material 7 are capacitively coupled, eventually "1"-writing voltage $V_{FB}$ "1" of the semiconductor base material 7 becomes as follows.

$$V_{FB}\text{"1"}=Vb-\beta_{WL} \times Vt_{WL}\text{"1"}-\beta_{BL} \times V_{BL} \qquad (7),$$

where the coupling ratio $\beta_{BL}$ between the bit line BL and the semiconductor base material 7 is also low. Consequently, as shown in FIG. 3D, the threshold voltage of the second n-channel MOS transistor region of a second semiconductor base material 7b connected with the word line WL becomes low. A "1" written state of the semiconductor base material 7 is set to a first data retention voltage (which is an example of a "first data retention voltage" described in Claims). A memory write operation (which is an example of a "memory write operation" described in Claims) is performed and this state is assigned to logical storage data "1."

Note that in the write operation, electron-hole pairs may be generated by an impact ionization phenomenon in a second boundary region between a first impurity region 3a and a first semiconductor base material 7a or in a third boundary region between a second impurity region 3b and a second semiconductor base material 7b rather than in the first boundary region, and the semiconductor base material 7 may be charged with the generated positive hole groups 9.

A memory erase operation (which is an example of a "memory erase operation" described in Claims) mechanism is described in FIGS. 4AA to 4AC and 4B. The semiconductor base material 7 between the N$^+$ layers 3a and 3b is electrically separated from the substrate, making up a floating body. FIG. 4AA shows that before the erase operation, the positive hole groups 9 generated by impact ionization in the previous cycle are stored in the semiconductor base material 7. As shown in FIG. 4AB, during an erase operation, the voltage of the source line SL is set to a negative voltage $V_{ERA}$. Here, $V_{ERA}$ is, for example, −3 V. Consequently, regardless of the value of an initial potential of the semiconductor base material 7, the pn junction between the N$^+$ layer 3a connected with the source line SL to serve as a source and the semiconductor base material 7 becomes forward-biased. As a result, the positive hole groups 9 generated by impact ionization in the previous cycle and stored in the semiconductor base material 7 are drawn into the N⁺ layer 3*a* in a source area, a potential $V_{FB}$ of the semiconductor base material 7 becomes $V_{FB}=V_{ERA}+Vb$, and the resulting voltage value becomes a second data retention voltage (which is an example of a "second data retention voltage" described in Claims). Here, Vb is the built-in voltage of the pn junction and is approximately 0.7 V. Therefore, when $V_{ERA}=-3$ V, the potential of the semiconductor base material 7 becomes −2.3 V. This value is the potential state of the semiconductor base material 7 in an erased state. Therefore, when a potential of the semiconductor base material 7 of the floating body becomes a negative voltage, the threshold voltage of the n-channel MOS transistor region increases due to the substrate bias effect. Consequently, as shown in FIG. 4AC, a threshold voltage of the second gate conductor layer 5*b* connected with the word line WL increases. The erased state of the semiconductor base material 7 turns to "0" of logical storage data. During the data read, if the voltage to be applied to the first gate conductor layer 5*a* joined to the plate line PL is set higher than the threshold voltage at a time when the logical storage data is "1" and lower than the threshold voltage at a time when the logical storage data is "0," the property that no current flows even if the voltage of the word line WL is increased is obtained. Note that an example of voltage conditions for major node contacts during the erase operation is shown in FIG. 4B.

FIGS. 5AA to 5AC are diagrams for explaining a read operation of the dynamic flash memory cell according to the first embodiment of the present invention. As shown in FIG. 5AA, when the semiconductor base material 7 is charged to the built-in voltage Vb (approximately 0.7 V), the threshold voltage of the second n-channel MOS transistor region having the second gate conductor layer 5*b* that is connected with the word line WL drops due to the substrate bias effect. This state is assigned to logical storage data "1." As shown in FIG. 5AB, a memory block selected before a write is set to an erased state "0" in advance and the voltage $V_{FB}$ of the semiconductor base material 7 is $V_{FB}$ "0." As a result of write operations, a written state "1" is stored randomly. As a result, logical storage data of logic "0" and logic "1" is created for the word line WL. As shown in FIG. 5AC, using a height difference between two threshold voltages for the word line WL, reading is done by a sense amplifier.

FIGS. 5BA to 5BC, are diagrams for explaining a block (which is an example of a "block" described in Claims) in which a plurality of the dynamic flash memory cells according to the first embodiment of the present invention is arrayed in a matrix (which is an example of "a plurality of . . . in a matrix" described in Claims).

Figure 5C:
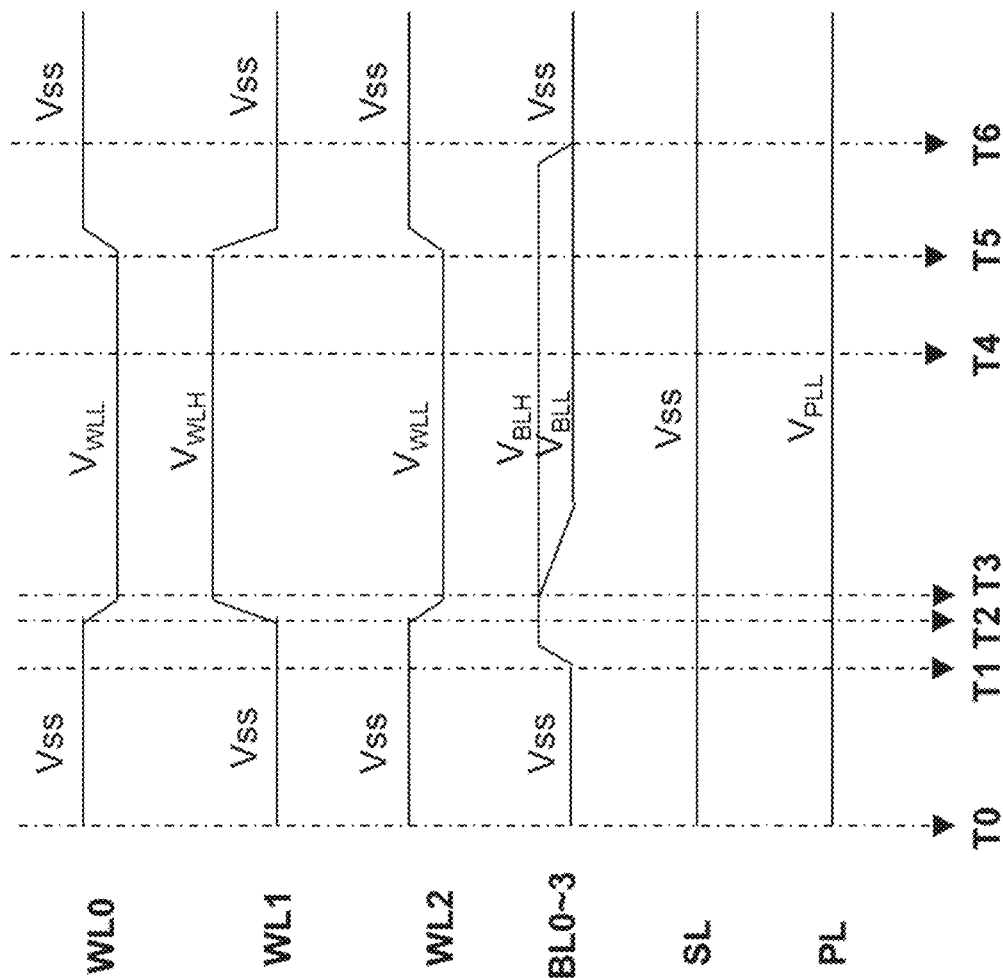
FIG. 5C is a diagram for explaining the read operation of the memory device having the SGT according to the first embodiment.

A bird's-eye view and sectional view of a 1-bit dynamic flash memory cell made up of one piece of semiconductor base material are shown, respectively, in FIGS. 5BA and 5BB. In FIGS. 5BA and 5BB, the dynamic flash memory cell is connected with the bit line BL, the source line SL, the plate line PL, and the word line WL. FIG. 5BC shows a plan view of a block in which multiple, namely, 3×4, dynamic flash memory cells are arrayed in a matrix. The dynamic flash memory cells can be arrayed by setting the pitch of the bit lines BL to 2F, the pitch of the word lines WL to 2F, and the 1-bit memory cell size to 4F×2F=4F², where F is feature size, which is one of design rules or ground rules. In a miniaturized dynamic flash memory cell, for example, F=15 nm. Thus, capacitive coupling between adjacent word lines WL is strong. For example, when a word line WL1 (which is an example of a "first word line" described in Claims) is selected and storage data is read to bit lines BL0 to BL3 from a memory cell connected to the word line WL1, a third word line WL0 (which is an example of a "third word line" described in Claims) adjacent to the word line WL1 and a second word line WL2 (which is an example of a "second word line" described in Claims) also undergo voltage changes due to capacitive coupling with the word line WL1. This causes storage data of memory cells connected to the word lines WL0 and WL2 to be read to the bit lines BL0 to BL3 as well, making it sometimes difficult to determine, using a sense amplifier circuit (which is an example of a "sense amplifier circuit" described in Claims), whether the storage data (which is an example of "storage data" described in Claims) of the memory cells is write data (which is an example of "write data" described in Claims) or erase data (which is an example of "erase data" described in Claims). Ingenuity in a reading method is required, and a reading method that solves this problem will be described using FIGS. 5C and 5D.

FIG. 5C shows an operation waveform diagram on major nodes during reading of the dynamic flash memory cell according to the first embodiment of the present invention. Description will be given of a block in which 3×4 dynamic flash memory cells shown in FIG. 5BC are arrayed in a matrix. For example, suppose the word line WL1 is selected and memory cells connected to the word line WL1 are read out. A memory read operation (which is an example of a "memory read operation" described in Claims) is started, and at time T1, the bit lines BL0 to BL3 rise from a bit line reset voltage Vss to a high voltage $V_{BLH}$ for reading bit lines. Here, for example, Vss may be 0 V and $V_{BLH}$ may be around 0.4 V. Rising edges of the bit lines BL0 to BL3 may occur at time T2 or later.

Next, when the word line WL1 is selected at time T2 in FIG. 5C, the voltage of the word line WL1 turns from a word line reset voltage Vss to a positive voltage (which is an example of a "positive voltage" described in Claims) $V_{WLH}$, which is a first voltage (which is an example of a "first voltage" described in Claims) and the voltage of the word lines WL0 and WL2 adjacent to the word line WL1 turns from the word line reset voltage Vss to a negative voltage (which is an example of a "negative voltage" described in Claims) $V_{WLL}$, which is a second voltage (which is an example of a "second voltage" described in Claims). Thus, the instant the word line WL1 is selected and goes high, the word lines WL0 and WL2 adjacent to the word line WL1 go low. This prevents the memory cells related to the word lines WL0 and WL2 from being misread to the bit lines BL0 to BL3 due to capacitive coupling with the word line WL1.

Next, at time T3 in FIG. 5C, the voltage of the word line WL1 becomes the first voltage $V_{WLH}$. As a result, when the storage data of the memory cell relevant to the word line WL1 is read to the bit lines BL0 to BL3, if the storage data is write data, the bit lines BL0 to BL3 turn to a low voltage $V_{BLL}$, but if the storage data is erase data, the bit lines BL0 to BL3 maintain the high voltage $V_{BLH}$. Next, at time T4, the sense amplifier is activated, and determines whether the storage data of the memory cell, i.e., the read data of the bit lines BL0 to BL3, is write data or erase data (not shown) by the sense amplifier. Subsequently, the word lines WL0 to WL2 return to the reset voltage Vss at time T6 and the bit lines BL0 to BL3 return to the reset voltage Vss at time T5, to finish the read operation.

Figure 5D:
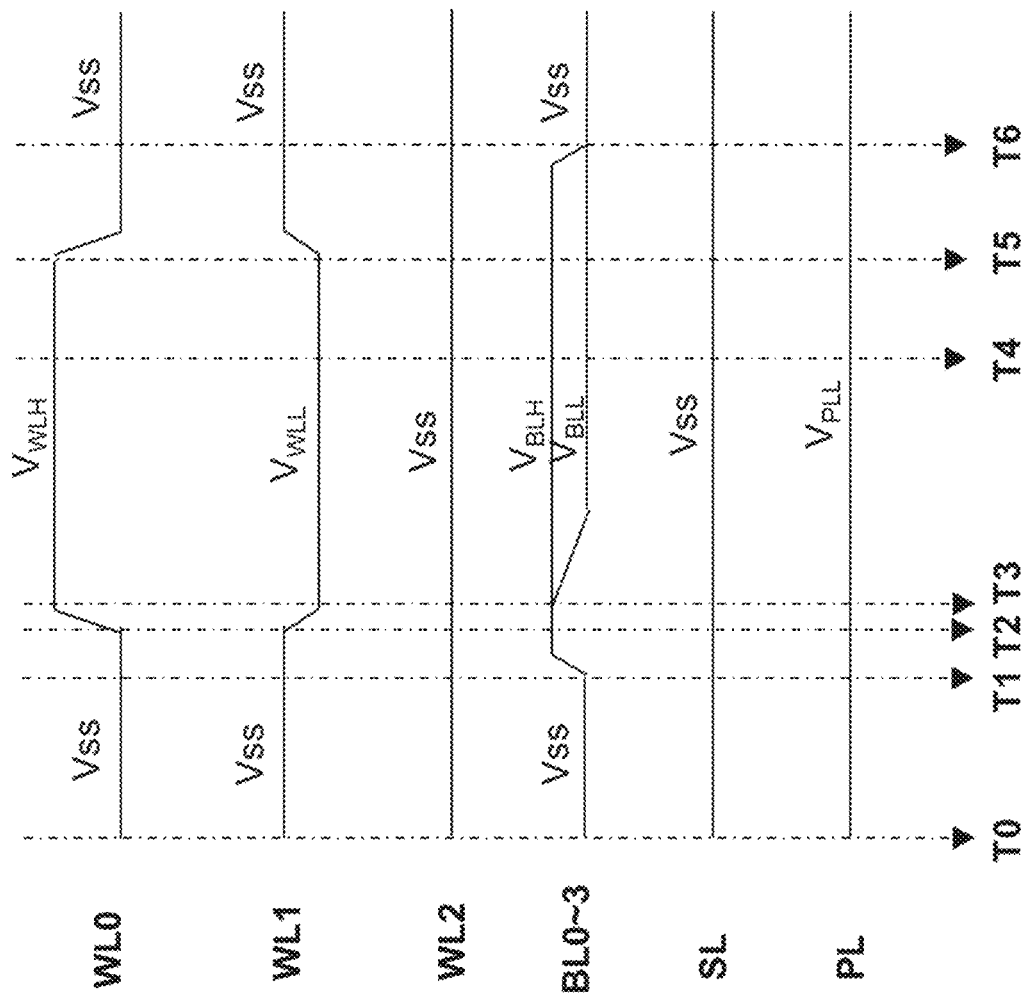
FIG. 5D is a diagram for explaining the read operation of the memory device having the SGT according to the first embodiment.

In FIG. 5D, unlike in FIG. 5C, it is assumed that, for example, the word line WL0 at an end of the block shown in FIG. 5BC and made up of 3×4 dynamic flash memory cells arrayed in a matrix is selected and that the memory cells connected to the word line WL0 are read out. In this case, when the word line WL0 turns from the word line reset voltage Vss to the first voltage $V_{WLH}$, which is a positive voltage, at time T2, the word line WL1 adjacent to the word line WL0 turns from the word line reset voltage Vss to the second voltage $V_{WLL}$, which is a negative voltage. This prevents the storage data of the memory cells related to the word line WL1 from being misread to the bit lines BL0 to BL3 due to capacitive coupling with the word line WL0. Note that the other operations are the same as those described in FIG. 5C.

Using FIGS. 5C and 5D, description will be given of a method for preventing misreading due to capacitive coupling of adjacent word lines WL during reading of the dynamic flash memory cell according to the first embodiment of the present invention. The reading method has made it possible to read extremely small dynamic flash memory cells of 4F² flash memory cell size, with high reliability. Besides, noise interference between adjacent word lines WL is suppressed, enabling high-speed read operations by a sense amplifier circuit.

Note that in FIG. 5BC, multiple dynamic flash memory cells according to the first embodiment of the present invention are arrayed in a matrix, making up a block, and the plate line PL of the block can be shared by the multiple dynamic flash memory cells. The plate line PL can be fixed to any voltage. Consequently, capacitive coupling between the plate line PL and the word line WL can greatly reduce interference noise caused by capacitive coupling between adjacent word lines.

Figure 6:
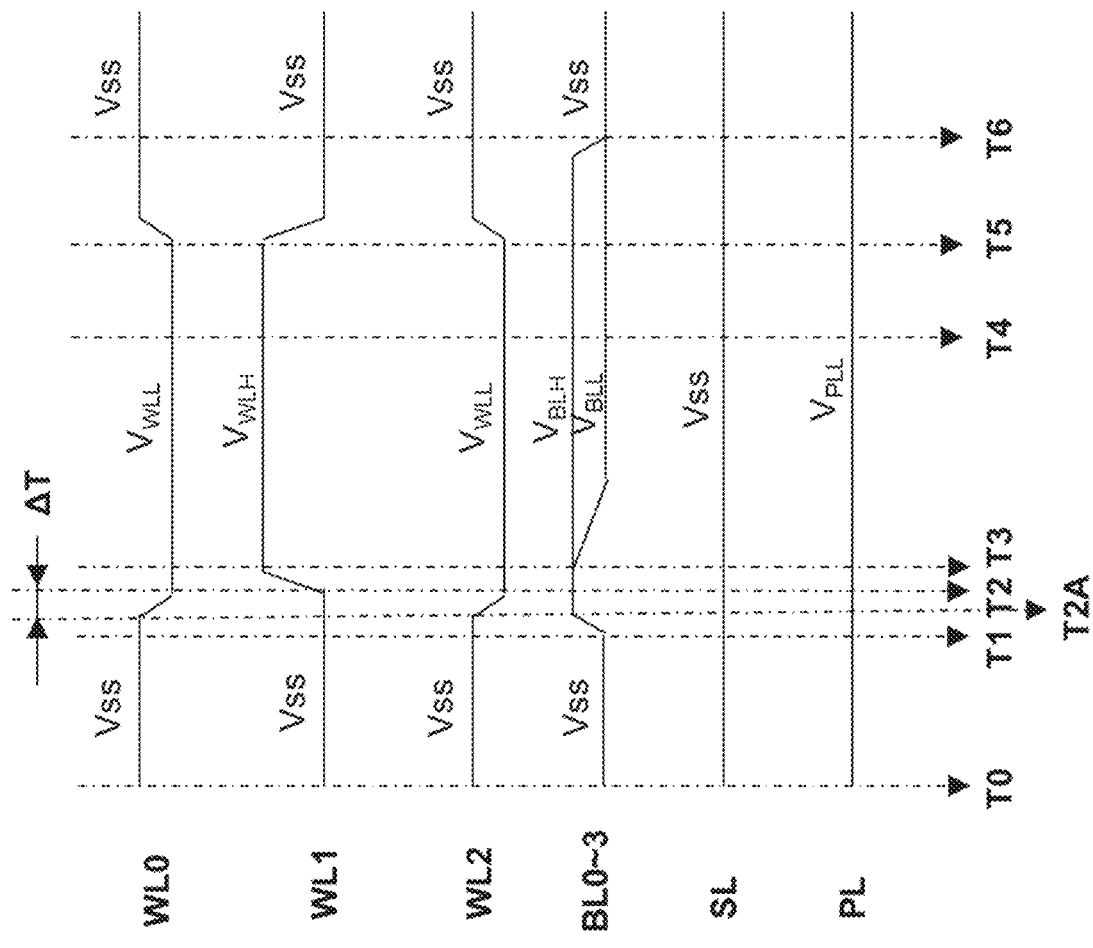
FIG. 6 is a diagram for explaining a read operation of a memory device having an SGT according to a second embodiment.
Figure 7A:
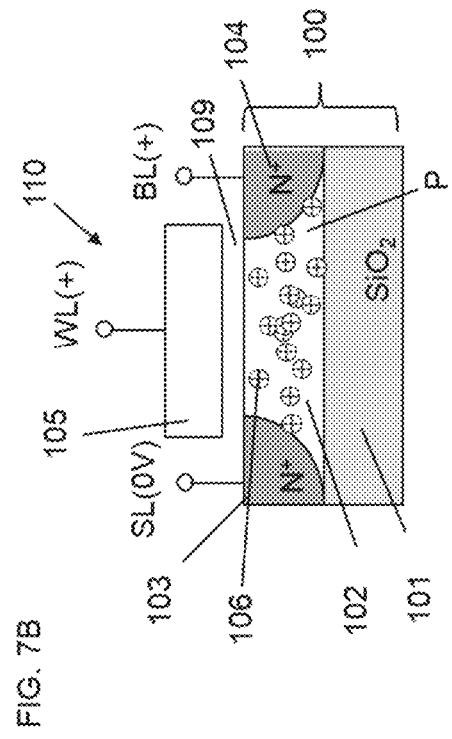
FIGS. 7A, 7B, 7C and 7D are diagrams for explaining a write operation of a capacitorless DRAM memory cell according to a conventional example.
Figure 7B:
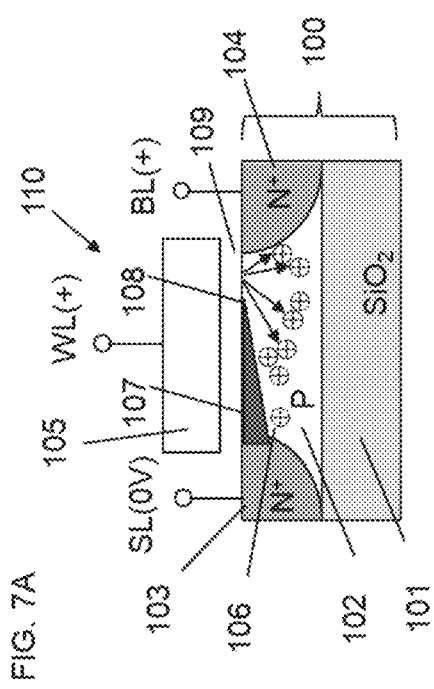
Figure 7C:
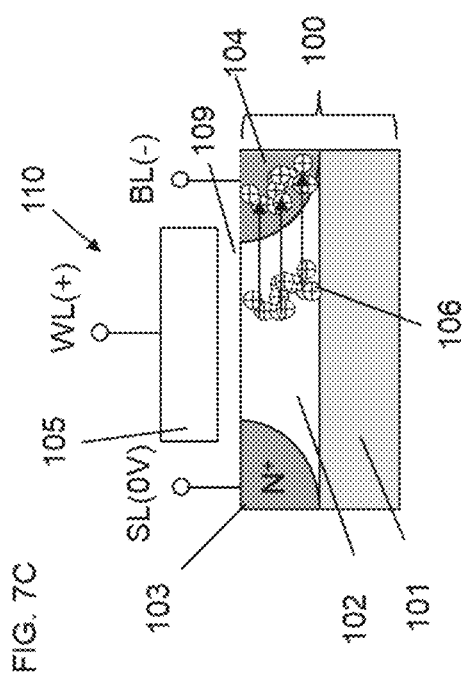
Figure 7D:
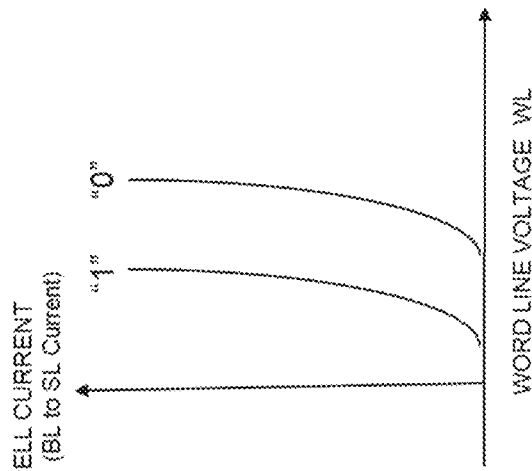
Figure 8A:
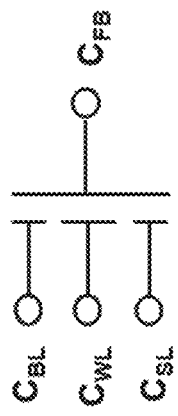
FIGS. 8A and 8B are diagrams for explaining problems in operations of the capacitorless DRAM memory cell according to the conventional example.
Figure 8B:
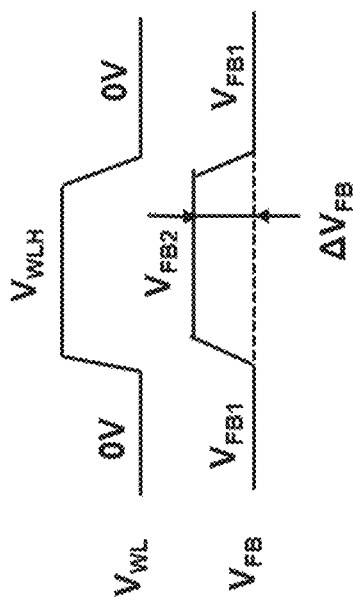
Figure 9C:
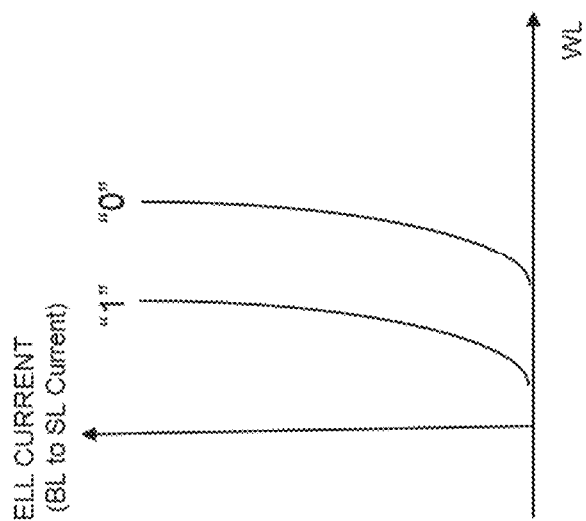
FIGS. 9A, 9B and 9C are diagrams for explaining a read operation of the capacitorless DRAM memory cell according to the conventional example.
Figure 9A:
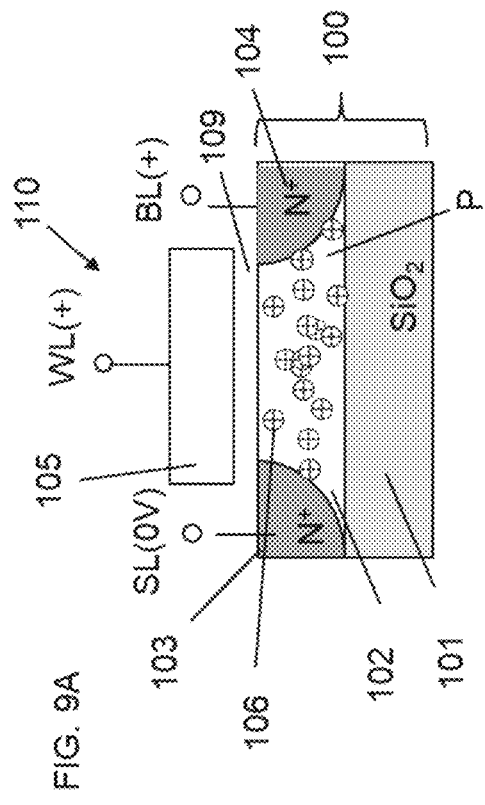
Figure 9B:
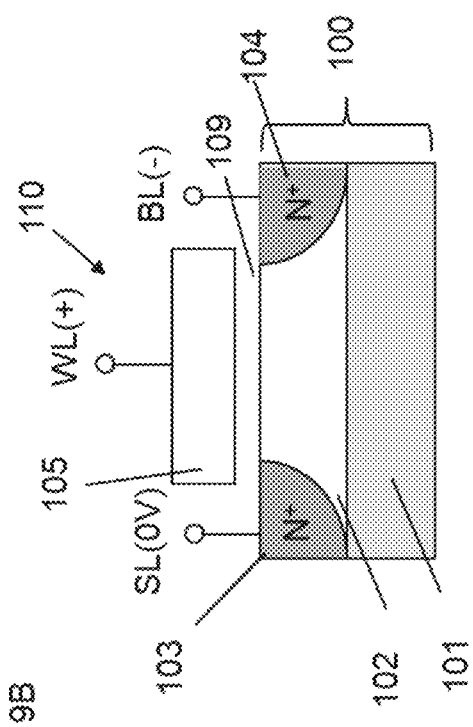

Note that whereas in FIGS. 5C and 5D and after-mentioned FIG. 6, the word line WL reset voltage, bit lines BL reset voltage, and source line SL reset voltage are set to Vss, the reset voltages may be set to voltages different from each other.

Note that in FIG. 1, desirably vertical length of the first gate conductor layer 5a connected with the plate line PL is made still larger than vertical length of the first gate conductor layer 5b connected with the word line WL such that $C_{PL} > C_{WL}$. However, by merely adding the plate line PL, a capacitive coupling ratio ($C_{WL}/(C_{PL}+C_{WL}+C_{BL}+C_{SL})$) of the word line WL to the semiconductor base material 7 is reduced. This reduces a potential fluctuation $\Delta V_{FB}$ in the semiconductor base material 7 of the floating body.

Besides, as the voltage $V_{PLL}$ of the plate line PL, a fixed voltage of, for example, 2 V may be applied in operation modes other than those erased selectively in block erase operations.

In FIG. 1, operation of the dynamic flash memory described in the present embodiment can be performed even if a horizontal sectional shape of the Si pillar 2 is circular, elliptical, or rectangular. Besides, circular, elliptical, and rectangular dynamic flash memory cells may be allowed to coexist on a same chip.

In FIG. 1, a dynamic flash memory element has been described by taking as an example an SGT that includes the first gate insulating layer 4a surrounding an entire lateral surface of the Si pillar 2 erected in a vertical direction on the substrate 1, the second gate insulating layer 4b, and the first gate conductor layer 5a and second gate conductor layer 5b surrounding the entire first gate insulating layer 4a and second gate insulating layer 4b. As indicated in the description of the present embodiment, it is sufficient if the present dynamic flash memory element is structured to satisfy the condition that the positive hole groups 9 generated by the impact ionization phenomenon are held in the semiconductor base material 7. For that, it is sufficient that the semiconductor base material 7 has a floating body structure separated from the substrate 1. Consequently, the above-mentioned operation of the dynamic flash memory can be performed using, for example, GAA (Gate All Around; see, for example, E. Yoshida: "A Capacitorless 1T-DRAM Technology Using Gate-Induced Drain-Leakage (GIDL) Current for Low-Power and High-Speed Embedded Memory," IEEE IEDM (2006)) technology, which is one of SGTs, or Nanosheet technology (see, for example, J. Y. Song, W. Y. Choi, J. H. Park, J. D. Lee, and B-G. Park: "Design Optimization of Gate-All-Around(GAA)MOSFETs," IEEE Trans. Electron Devices, vol. 5, no. 3, pp. 186-191, May 2006), even if the semiconductor base material of the semiconductor base material is formed horizontally to the substrate 1. A device structure (see, for example, J. Wan, L. Rojer, A. Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012); T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp 1510-1522 (2002); T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006); E. Yoshida: "A Capacitorless 1T-DRAM Technology Using Gate-Induced Drain-Leakage (GIDL) Current for Low-Power and High-Speed Embedded Memory," IEEE IEDM (2006)) that uses SOI (Silicon On Insulator) may also be used. In this device structure, a bottom of a semiconductor base material is in contact with an insulating layer of an SOI substrate and surrounds other semiconductor base material while being surrounded by a gate insulating layer and an element separating insulating layer. In this structure, again the semiconductor base material has a floating body structure. In this way, it is sufficient if the dynamic flash memory element provided by the present embodiment satisfies the condition that the semiconductor base material has a floating body structure. Even with a structure in which a Fin transistor (see, for example, H. Jiang, N. Xu, B. Chen, L. Zeng1, Y. He, G. Du, X. Liu and X. Zhang: "Experimental investigation of self-heating effect (SHE) in multiple-fin SOI FinFETs," Semicond. Sci. Technol. 29 (2014) 115021 (7pp)) is formed on an SOI substrate, the present dynamic flash operation can be performed as long as the semiconductor base material has a floating body structure.

In "1" writing, electron-hole pairs may be generated using a GIDL (Gate Induced Drain Leakage) current (see, for example, E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-69, April 2006) and the semiconductor base material 7 may be filled with the generated positive hole groups.

Equations (1) to (10) in the present specification and drawings are used to quantitatively describe phenomena, and are not intended to limit the phenomena.

Besides, an example of conditions for the erase operation has been shown in FIG. 4B. In contrast, if a situation in which the positive hole groups 9 in the semiconductor base material 7 are removed from both or one of the N⁺ layer 3a and N⁺ layer 3b can be realized, the voltages applied to the source line SL, the plate line PL, the bit line BL, and the word line WL may be changed.

Besides, in a vertical direction in FIG. 1, in that part of the semiconductor base material 7 which is surrounded by the insulating layer 6, which is the first insulating layer, potential distributions of a first semiconductor base material 7a and a second semiconductor base material 7b are formed by being joined together. Consequently, the first semiconductor base material 7a and second semiconductor base material 7b of the semiconductor base material 7 are joined together in the vertical direction via a region surrounded by the insulating layer 6, which is the first insulating layer.

Besides, in FIG. 1, the first gate conductor layer 5a may be divided, in planar view or in a vertical direction, into two or more parts, which may be operated synchronously or asynchronously, each as a conductor electrode of a plate line, by a same drive voltage or different drive voltages. Similarly, the second gate conductor layer 5b may be divided, in planar view or in a vertical direction, into two or more parts, which may be operated synchronously or asynchronously, each as a conductor electrode of a word line, by a same drive voltage or different drive voltages. This also enables the dynamic flash memory operation. When the first gate conductor layer 5a is divided into two or more parts, at least one of the resulting first gate conductor layers serves the role of the first gate conductor layer 5a. Also, when the second gate conductor layer 5b is divided, at least one of the resulting second gate conductor layers serves the role of the second gate conductor layer 5b. In the vertical direction, one of the first gate conductor layer 5a and the second gate conductor layer 5b may be placed on opposite sides of the other gate conductor layer, i.e., the first gate conductor layer 5a or the second gate conductor layer 5b.

The conditions of the voltages applied to the bit lines BL, the source lines SL, the word lines WL, and the plate lines PL as well as the voltage of the floating body are exemplary in performing basic operations including erase operations, write operations, and read operations, and other voltage conditions that allow the basic operations of the present invention to be performed may be used.

Besides, in FIG. 1, the first gate conductor layer 5a may be connected to the word line WL and the second gate conductor layer 5b may be connected to the plate line PL. This also enables the present dynamic flash memory operation described above.

Alternatively, a junctionless structure, in which the N+ layers 3a and 3b of the dynamic flash memory cell shown in FIG. 1 and the p-layer 7 of the semiconductor base material are made equal in electrical conductivity, may be used. This similarly applies to other embodiments.

The present embodiment has the following features.
(Feature 1)

In the dynamic flash memory cell according to the present embodiment, the N+ layers 3a and 3b, which are to become the source and the drain, the semiconductor base material 7, the first gate insulating layer 4a, the second gate insulating layer 4b, the first gate conductor layer 5a, and the second gate conductor layer 5b are formed into the shape of a pillar as a whole. Then, the N+ layer 3a to become the source is connected to the source line SL, the N+ layer 3b to become the drain is connected to the bit line BL, the first gate conductor layer 5a is connected to the plate line PL, and the second gate conductor layer 5b is connected to the word line WL. The gate capacitance of the first gate conductor layer 5a connected with the plate line PL is structured to be higher than the gate capacitance of the second gate conductor layer 5b connected with the word line WL. In the present dynamic flash memory cell, the first gate conductor layer and the second gate conductor layer are stacked in the vertical direction. Consequently, even if the gate capacitance of the first gate conductor layer 5a connected with the plate line PL is structured to be higher than the gate capacitance of the second gate conductor layer 5b connected with the word line WL, the area of the memory cell is not increased in planar view. This makes it possible to achieve higher performance and greater packaging density of the dynamic flash memory cell at the same time. During the data read, if the voltage to be applied to the first gate conductor layer 5a joined to the plate line PL is set higher than the threshold voltage at a time when the logical storage data is "1" and lower than the threshold voltage at a time when the logical storage data is "0," the property that no current flows even if the voltage of the word line WL is increased is obtained. This leads to a further increase in an operating margin of the dynamic flash memory cell.
(Feature 2)

The word line pitch of the dynamic flash memory cell according to the first embodiment of the present invention is as minute as 2F, making it possible to completely prevent misreading due to capacitive coupling between adjacent word lines and thereby provide a highly reliable dynamic flash memory cell. Besides, since interference noise between adjacent word lines is reduced, it is possible to achieve a high-speed read operation.
(Feature 3)

Taking a look at the role of the first gate conductor layer 5a connected with the plate line PL of the dynamic flash memory cell according to the first embodiment of the present invention, when the dynamic flash memory cell performs write and read operations, the voltage of the word line WL swings up and down. In so doing, the plate line PL serves the role of reducing the capacitive coupling ratio between the word line WL and the semiconductor base material 7. This makes it possible to greatly reduce the effect of voltage variations of the semiconductor base material 7 when the voltage of the word line WL swings up and down. This in turn makes it possible to increase a difference in the threshold voltage of an SGT transistor of the word line WL, the difference representing logic "0" or logic "1." This leads to an increase in an operating margin of the dynamic flash memory cell.
(Feature 4)

Multiple dynamic flash memory cells according to the first embodiment of the present invention are arrayed in a matrix in FIG. 5BC, making up a block, and the plate line PL of the block can be shared by the multiple dynamic flash memory cells. The plate line PL can be fixed to any voltage. Consequently, capacitive coupling between the plate line PL and the word line WL can greatly reduce interference noise caused by capacitive coupling between adjacent word lines.

Second Embodiment

A read operation of a dynamic flash memory cell according to the second embodiment will be described with reference to FIG. 6.

FIG. 6 shows an operation waveform diagram on major nodes during reading of the dynamic flash memory cell according to the second embodiment of the present invention. It is assumed here that, for example, the word line WL1 of the block shown in FIG. 5BC and made up of 3×4 dynamic flash memory cells arrayed in a matrix is selected and that the memory cells connected to the word line WL1 are read out. A memory read operation is started, and at time T1, the bit lines BL0 to BL3 rise from a bit line reset voltage Vss to a high voltage $V_{BLH}$ for reading bit lines. Here, for example, Vss may be 0 V and $V_{PL}$ may be around 0.4 V. Rising edges of the bit lines BL0 to BL3 may occur at time T2 or later.

Description of the memory read operation of the dynamic flash memory cell according to the second embodiment of the present invention will be continued using FIG. 6. At a first time point (which is an example of a "first time point" described in Claims) T2A, the voltage of the word lines WL0 and WL2 adjacent to the word line WL1 turns from the word line reset voltage Vss to a negative voltage $V_{WLL}$, which is a second voltage. Then, at a second time point (which is an example of a "second time point" described in Claims) T2 after an elapse of a time ΔT, the voltage of the word line WL1 turns from the word line reset voltage Vss to a positive voltage (which is an example of a "positive voltage" described in Claims) $V_{WLH}$, which is a first voltage (which is an example of a "first voltage" described in Claims). Thus, even if the word line WL1 is selected and goes high, the word lines WL0 and WL2 adjacent to the word line WL1 have gone low before then. This prevents the memory cells related to the word lines WL0 and WL2 from being misread to the bit lines BL0 to BL3 due to capacitive coupling with the word line WL1. Note that the rest of the read operation is the same as that described in FIG. 5C.

(Feature)

In the read operation of the dynamic flash memory cell according to the second embodiment of the present invention, before the word line WL selected for reading rises from the word line reset voltage Vss to the high voltage $V_{WLH}$, the adjacent word lines WL fall from the word line reset voltage Vss to the low voltage $V_{WLL}$. This makes it possible to completely prevent misreading due to capacitive coupling between adjacent word lines and thereby provide a highly reliable dynamic flash memory cell. Besides, since interference noise between adjacent word lines is reduced, it is possible to achieve a high-speed read operation.

Other Embodiments

Note that whereas a Si pillar is formed in the present invention, a semiconductor pillar made of a semiconductor material other than Si may be used. This similarly applies to other embodiments of the present invention.

In the dynamic flash memory cells according to the first and second embodiments of the present invention, the pitch between adjacent bit lines BL is also 2F. During write and read operations between adjacent bit lines BL, interference noise caused by capacitive coupling between the adjacent bit lines BL can be suppressed completely using a bit line shielding technique. With the bit line shielding technique, during a write operation or a read operation, for example, when an odd-numbered bit line BLo is engaged in a write operation or a read operation, an adjacent even-numbered bit line BLe is grounded and used as a shield line for the odd-numbered bit line BLo. This makes it possible to completely suppress interference noise between adjacent bit lines.

In relation to the dynamic flash memory cells according to the first and second embodiments of the present invention, description has been given of methods for reducing interference noise caused by capacitive coupling between adjacent word lines in read operations of the memory cells. In write operations of the memory cells, when the word line WL1 is selected and the word line WL1 turns from the word line reset voltage Vss to a high voltage $V_{WLHW}$ for writing into word lines, after an elapse of a predetermined time, the bit lines BL0 to BL3 may be changed from the bit line reset voltage Vss to a high voltage $V_{BLHW}$ for writing into bit lines. Then, when the word lines WL0 and WL2 adjacent to the word line WL1 rise to the high voltage $V_{WLHW}$ of the word line WL1, due to capacitive coupling with the word line WL1, even if the voltage of the word lines WL0 and WL2 rises slightly above the word line reset voltage Vss, since the bit lines BL0 to BL3 still do not reach the high voltage $V_{BLHW}$ for writing into bit lines, miswriting into the memory cells related to the word lines WL0 and WL2 does not occur. The method for making the bit lines BL0 to BL3 go high after an elapse of a predetermined time from the rise of the word line WL1 is also effective for read operations. In this case, after noise against the adjacent word lines WL0 and WL1 subsides, the bit lines BL0 to BL3 need to be set to the reading voltage $V_{BLH}$, and application of the technique to a read operation involves a tradeoff with read speed. Note that in write operations, because the high voltage $V_{WLHW}$ for writing into the word line is sufficiently higher than the high voltage $V_{WLH}$ for reading the word line WL1, even if the adjacent word lines WL0 and WL2 increase slightly in voltage, no miswriting occurs.

In a vertical NAND-type flash memory circuit, using a semiconductor pillar as a channel, multiple stacks of memory cells made up of a tunnel oxide layer, a charge storage layer, an interlayer insulation layer, and a control conductor layer surrounding the semiconductor pillar are formed in the vertical direction. There are a source line impurity region corresponding to a source and a bit line impurity region corresponding to a drain on opposite ends of the semiconductor pillar of the memory cells. If, for one memory cell, one of memory cells on opposite sides of the memory cell is a source, the memory cell on the other side serves as a drain. In this way, the vertical NAND-type flash memory circuit is a type of SGT circuits. Thus, the present invention is applicable to a mixed circuit with a NAND-type flash memory circuit.

In "1" writing, electron-hole pairs may be generated by impact ionization phenomenon using a GIDL (Gate Induced Drain Leakage) current described in [E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-69, April 2006], and the floating body FB may be filled with the generated positive hole groups. This similarly applies to other embodiments of the present invention.

In FIG. 1, in a structure in which polarity of conductivity type of each of the N+ layers 3a and 3b and p-layer Si pillar 2 is reversed, the dynamic flash memory operation is performed. In this case, in the Si pillar 2, which is n-type, majority carriers become electrons. Thus, electron groups generated by impact ionization are accumulated in the semiconductor base material 7, and a "1" state is established.

The present invention can be embodied or modified in various forms without departing from the spirit and scope of the present invention in a broad sense. Also, the embodiments described above are meant to be illustrative, and not to limit the scope of the present invention. The embodiments and variations described above can be combined as desired. Furthermore, even if some components of the embodiments described above are removed as required, the resulting inventions fall within the scope of the technical idea of the present invention.

INDUSTRIAL APPLICABILITY

The semiconductor memory device according to the present invention provides a dynamic flash memory, which is a memory device that uses a high-density, high-performance SGT.

What is claimed is:

1. A semiconductor memory device comprising a block in which a plurality of semiconductor memory cells is arrayed in a matrix, each of the semiconductor memory cells including:
   semiconductor base material erected on a substrate in a vertical direction of the substrate or extended on the substrate in a horizontal direction,
   a first impurity region and a second impurity region provided on opposite ends of the semiconductor base material;
   a gate insulating layer placed in contact with a lateral surface of the semiconductor base material between the first impurity region and the second impurity region;
   a first gate conductor layer covering part or all of the gate insulating layer; and
   a second gate conductor layer located adjacent to the first gate conductor layer and placed in contact with a lateral surface of the gate insulating layer,
   wherein positive hole groups generated by an impact ionization phenomenon or by a gate-induced drain leakage current are held in the semiconductor base material by controlling voltages applied to the first gate conductor layer, the second gate conductor layer, the first impurity region, and the second impurity region,
   a memory write operation is performed by setting a voltage of the semiconductor base material to a first data retention voltage,
   a memory erase operation is performed by controlling voltages applied to the first impurity region, the second impurity region, the first gate conductor layer, and the second gate conductor layer and thereby extracting a residual positive hole group out of the positive hole groups from one or both of the first impurity region and the second impurity region,
   the voltage of the semiconductor base material is set to a second data retention voltage lower than the first data retention voltage, and
   in the block,
      in each of the semiconductor memory cells, the first impurity region is connected with a source line, the second impurity region is connected with a bit line, and one of the first gate conductor layer and the second gate conductor layer is connected with word lines and another is connected with a first drive control line, and
      with a selected one of the word lines being designated as a first word line and a word line adjacent to the first word line being designated as a second word line, using a voltage applied to the source line, the bit line, and the first drive control line, a first voltage applied to the first word line, and a second voltage applied to the second word line, a memory read operation is performed to read storage data of a plurality of the semiconductor memory cells selected by the first word line, to the bit line.

2. The semiconductor memory device according to claim 1, wherein with a word line adjacent to the first word line and located on an opposite side of the second word line being designated as a third word line, using a voltage applied to the source line, the bit line, and the first drive control line, the first voltage applied to the first word line, and a second voltage applied to one or both of the second word line and the third word line, a memory read operation is performed to read storage data of the plurality of semiconductor memory cells selected by the first word line, to the bit line.

3. The semiconductor memory device according to claim 1, wherein the storage data of the semiconductor base material is read to the bit line and a sense amplifier circuit determines whether the storage data is write data or erase data.

4. The semiconductor memory device according to claim 1, wherein the first voltage is a positive voltage and the second voltage is a negative voltage.

5. The semiconductor memory device according to claim 2, wherein one or both of the second word line and the third word line turn(s) to the second voltage at a first time point, the first word line turns to the first voltage at a second time point later than the first time point, and a memory read operation is performed to read storage data of the plurality of semiconductor memory cells selected by the first word line, to the bit line.

6. The semiconductor memory device according to claim 5, wherein one or both of the second word line and the third word line turn(s) to the negative voltage at the first time point, the first word line turns to the positive voltage at the second time point, and a memory read operation is performed to read storage data of the plurality of semiconductor memory cells selected by the first word line, to the bit line.

7. The semiconductor memory device according to claim 1, wherein the first drive control line is common to all the semiconductor memory cells making up the block.

8. The semiconductor memory device according to claim 1, wherein first gate capacitance between the first gate conductor layer and the semiconductor base material is higher than second gate capacitance between the second gate conductor layer and the semiconductor base material.

9. The semiconductor memory device according to claim 1, wherein one or both of the first gate conductor layer and the second gate conductor layer are divided into two or more separate gate conductor layers in planar view or in a vertical direction and the separate gate conductor layers are operated synchronously or asynchronously.

10. The semiconductor memory device according to claim 9, wherein in the vertical direction, either the separate gate conductor layers of the first gate conductor layer are placed on opposite sides of the second gate conductor layer, or the separate gate conductor layers of the second gate conductor layer are placed on opposite sides of the first gate conductor layer.

* * * * *